United States Patent [19]

Pilette et al.

[11] 4,378,264

[45] Mar. 29, 1983

[54] INTEGRATED LAMINATING PROCESS

[75] Inventors: Yvan P. Pilette, Lawrenceville, N.J.; Daniel D. Johnson, Yorklyn, Del.

[73] Assignee: E. I. Du Pont de Nemours and Company, Wilmington, Del.

[21] Appl. No.: 244,792

[22] Filed: Mar. 27, 1981

Related U.S. Application Data

[63] Continuation-in-part of Ser. No. 153,634, May 27, 1980, abandoned.

[51] Int. Cl.³ .................. B32B 31/00; B44C 1/00; G03C 1/90
[52] U.S. Cl. .................. 156/238; 156/241; 156/249; 156/270; 156/542; 430/270; 430/287
[58] Field of Search .................. 156/238, 231, 289, 223, 156/249, 248, 268, 270, 230, 254, 269, 270, 241, 236; 430/935, 270, 254, 273, 260, 256, 281, 253, 287, 905; 225/2, 106

[56] References Cited

U.S. PATENT DOCUMENTS

| | | | |
|---|---|---|---|
| 3,261,686 | 7/1966 | Celeste | 430/288 |
| 3,469,982 | 9/1969 | Celeste | 430/256 |
| 3,498,788 | 3/1970 | Haas | 430/253 |
| 3,615,448 | 10/1971 | Yeshin | 430/281 |
| 3,629,036 | 2/1971 | Isaacson | 156/241 |
| 3,775,112 | 11/1973 | Alsup et al. | 430/287 |
| 3,785,817 | 1/1974 | Kuchta | 430/253 |
| 4,069,076 | 1/1978 | Fickes | 156/236 |
| 4,075,051 | 2/1978 | Brzozowski | 156/236 |

Primary Examiner—Edward C. Kimlin
Assistant Examiner—Louis Falasco

[57] ABSTRACT

An integrated process for laminating a continuous layer of photosensitive composition to the surface of each member of a series of substrate elements and automatically trimming the layer from the leading and trailing edges of the laminated substrate elements.

12 Claims, 5 Drawing Figures

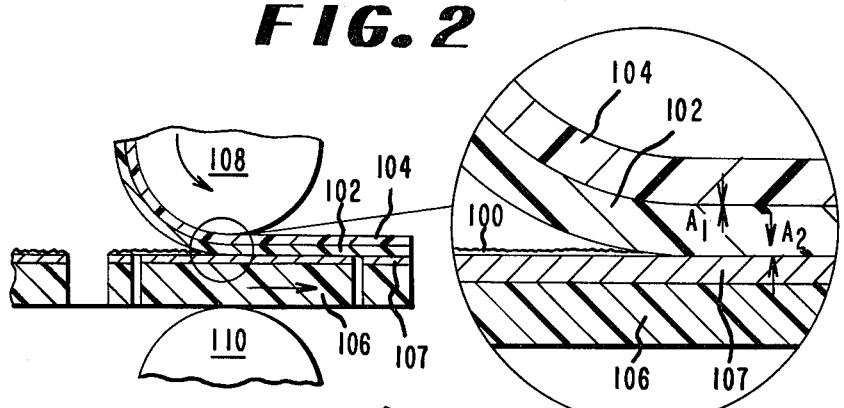
FIG. 2
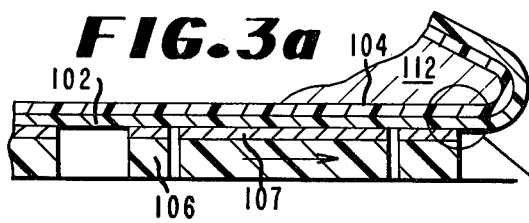
FIG. 3a
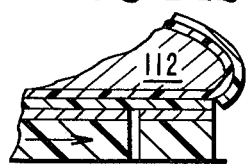
FIG. 3b
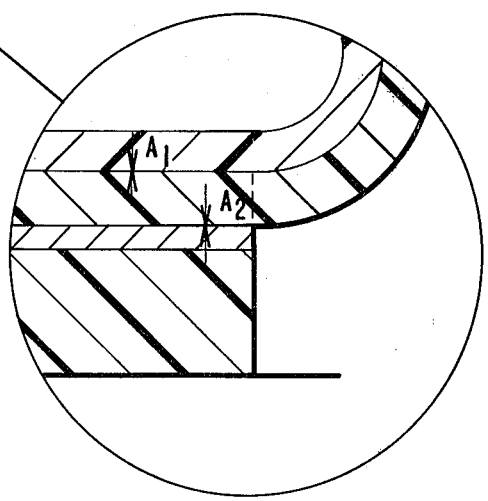
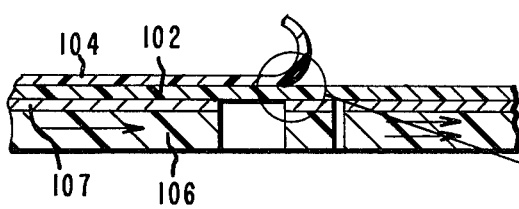
FIG. 4
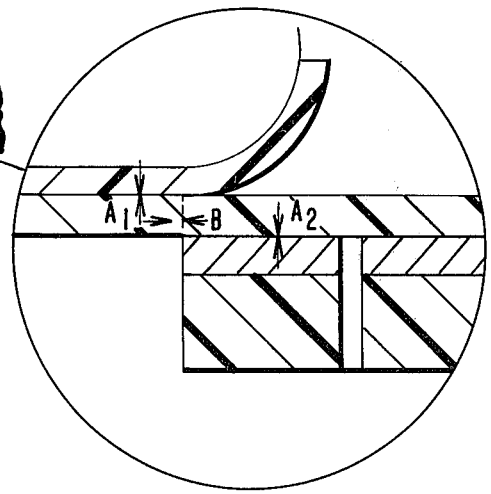

INTEGRATED LAMINATING PROCESS

RELATED APPLICATION

The present application is a continuation-in-part of Ser. No. 153,634 filed May 27, 1980, now abandoned.

TECHNICAL FIELD

The invention relates to a process for laminating a continuous layer to a substrate and particularly to an integrated lamination process in which the laminated layer is trimmed automatically.

BACKGROUND OF THE INVENTION AND PRIOR ART DISCUSSION

U.S. Pat. No. 3,469,982 discloses a photoresist process comprising applying a photopolymerizable layer supported on a support film to a surface, followed by imagewise exposure of the layer, stripping away the support film, and washing away the unexposed area of the layer to leave a resist image protecting the aforesaid surface from such treatments as etching or plating.

The patent discloses solution coating of a photopolymerizable composition onto the support film, followed by drying and then lamination of the resultant dry coating to a surface such as copper-clad printed circuit board (Example V) to carry out the photoresist process. In commercial practice, however, the dried photopolymerizable coating, which must remain adhered to the support during storage and shipment, has always been supplied sandwiched between the support film and a cover sheet, such as disclosed in Example I of the patent. This has enabled the sandwich to be rolled up upon itself by the photoresist manufacturer and be supplied to the user, e.g. printed circuit manufacturer, as a compact, easy to handle roll. The cover sheet permitted the roll to be unrolled by the user. Without the cover film, pressing the photopolymerizable layer against the backside of the support film would cause that layer to adhere. Consequently, the film could not be unrolled without damaging the photopolymerizable layer. In use, the cover sheet would be stripped away and discarded, followed by the photoresist processing described above. U.S. Pat. No. 3,782,939 discloses a need for the cover sheet because of the alleged tackiness of the photopolymerizable layer. In fact, the layer need not be tacky to the touch, but can adhere under pressure, for example when it is rolled up.

The equipment used to practice the photoresist process has consisted in general of separate pieces of equipment, such as a cleaner, scrubber for cleaning the copper-clad circuit boards, oven for preheating the boards, roll laminator applying heat to the photoresist and board as it laminates them together, and exposure (actinic radiation) station, and solvent development apparatus. Typically, manual transfer and positioning of the circuit board was necessary between each piece of equipment, involving exposure and less-than-desired reproducibility leading to yield loss in the process.

Various attempts have been made to automate the photoresist process but automation has been adopted to only a limited extent.

U.S. Pat. No. 3,547,730 discloses a process and apparatus for automating the photoresist process, involving a device for sequential feeding of shaped articles such as circuit boards and a laminator for receiving the boards and laminating a photosensitive layer thereto. Sequentially laminated boards become tied together by a web of support film and the photosensitive layer extending between boards as shown in FIG. 2, and the layer of the top and bottom web become laminated together to form a "hinge" (col. 5, lines 35-39). Next the support film is stripped away by rolls 12 and 13. This stripping away provides a forwarding motion to the circuit board to bring it into abutting relationship with the preceding board to force it into the exposure unit. The web of photosensitive layer left extending between successive boards after the support film is stripped away, folds over upon itself in the manner of a "hinge", when the boards become butted together. This hinge can be trimmed away by a knife prior to entering the exposure unit.

U.S. Pat. No. 3,547,730 also discloses the cleaning of a circuit board between a feed station and lamination station, the preheating of the board and/or photosensitive layer between their respective feeds and the lamination station, and rolls 10 for stripping away the cover sheet prior to lamination.

U.S. Pat. No. 4,025,380 discloses the sequential feeding of circuit boards onto a conveyor which passes them through an infrared preheater and then past sensor switches which control the operation of laminating rolls and cutting devices which cut a photosensitive layer to the desired length prior to lamination and then laminate the cut sheet (layer) to the circuit board. The patent also discloses rolls 63 for stripping off of the cover film prior to the lamination.

Improvements in specific process steps have been disclosed. U.S. Pat. No. 3,629,036, discloses that the elevated temperature required for laminating a photoresist to a substrate introduces disadvantages of limiting the types of photoresist and substrate materials that can be used and produces inferior bonding to the substrate. The patent purports to solve these problems by room temperature lamination after first applying a solution of dissolved resist to the substrate and then doing the lamination. The patent provides for a release layer between the photoresist layer and its support film to enable the film to be stripped away from the photoresist layer after lamination.

U.S. Pat. No. 3,794,546 discloses the use of an adhesive web to adhere to a support film of a photohardenable element so as to delaminate the support film from at least the unhardened area of a an imagewise exposed photohardenable layer laminated to a receptor sheet.

U.S. Pat. No. 4,075,051 discloses a process for self trimming of a photoresist layer laminated to a substrate, i.e., the portion of the layer extending past the edges of the substrate is removed without any cutting step. This is accomplished by applying a liquid weakening agent at least to the aforesaid portion of the layer, but possibly to the entire layer by pre-wetting of the substrate with the agent, and then peeling away either the cover sheet (support film) or an auxiliary permeable sheet which has a greater adhesion to the layer than the cohesive strength (as a result of the weakening agent) of the layer. The portion of the layer extending past the edge of the substrate tears along the edge of the substrate by the action of peeling away the cover sheet or permeable sheet and is removed with the sheet. The weakening agent is either a solvent for the photoresist or is a softening agent for it. The patent discloses the use of a conventional roll type laminator and pressure and heat for adhering the photoresist layer to the substrate.

Though the prior art methods of lamination are satisfactory for many applications, there is a need for even more precise and uniform lamination methods, especially where printed circuit boards having a very high line density are being fabricated.

BRIEF DESCRIPTION OF THE INVENTION

The invention is directed to an integrated process for laminating a continuous layer of photosensitive composition to a surface of each member of a series of substrate elements and trimming the layer from at least one of the transverse edges of the laminated substrate elements comprising the sequential steps of:

(1) advancing a continuous layer of photosensitive organic polymeric composition, the layer being supported on one side by a strippable polymeric film, and a first substrate to the nip of a set of laminating rolls;

(2) contacting the unsupported surface of the supported layer with a surface of the substrate element within the nip under pressure to effect lamination of the layer to the surface of the substrate element;

(3) optionally removing the support film from the layer as the laminated substrate element emerges from the nip of the laminating rolls and continuing advancement of the laminated substrate element until the support film is completely removed from the laminated layer;

(4) by which pulling on the laminated substrate element along its longitudinal axis in the direction of advancement by which the breaking strength of the laminated layer and, if present, the support film is exceeded at the trailing edge of the substrate transversely to the direction of advancement; and (5) repeating the sequence of steps (2) through (4) with respect to subsequent substrate elements in the series.

In a preferred aspect of the invention, the support film is removed from the layer as it emerges from the nip of the laminating rolls by bending the film back along the longitudinal axis of the advancing layer at an obtuse angle, the radius of the bend being sufficiently small that the breaking strength of the layer on the leading edge of the substrate element is exceeded.

BRIEF DESCRIPTION OF THE DRAWING

Further advantages and details of the invention will be apparent by reference to the Drawings which consists of four figures, as follows:

FIG. 2 is a schematic drawing which illustrates in cross section a preferred method of substrate treatment prior to lamination of photosensitive layers thereto;

FIGS. 3 A and B are schematic drawings which illustrates in cross section a preferred method of trimming photosensitive layer from the leading edge of substrates laminated by this process; and FIG. 4 is a schematic drawing which illustrates in cross section a preferred method of trimming photosensitive layer from the trailing edge of substrates laminated by the process of the invention.

DETAILED DESCRIPTION OF THE INVENTION

A. Photosensitive Layer Element

Figure 1:
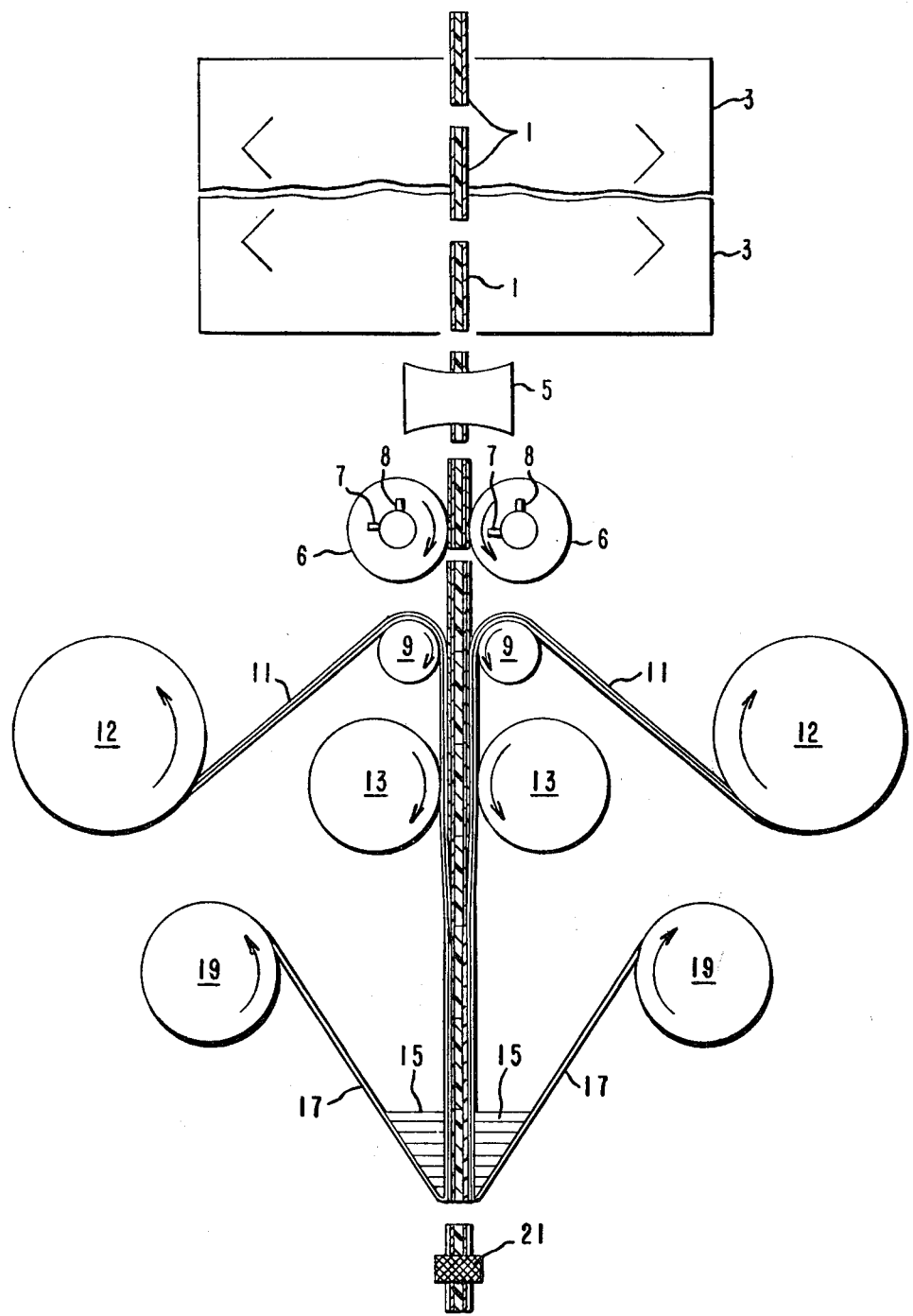
FIG. 1 is a schematic drawing which illustrates a preferred application of the process of the invention in a continuous laminating process.

The invention may be used advantageously in the lamination of a broad spectrum of thermoplastic layers. The invention is particularly useful for the lamination of photosensitive resist elements to substrates which are to be used for making printed circuit boards. The invention is also useful for lamination of photosensitive layers to substrates in the preparation of lithographic printing plates.

In practicing the invention, photosensitive film resists of various types may be used. In general photohardenable, negative-working resists are photopolymerizable films of the type disclosed in U.S. Pat. No. 3,469,982 and the photocrosslinkable elements of the type disclosed in U.S. Pat. No. 3,526,504. Positive-working, resist elements may be of the photosolubilizable type, e.g., such as the o-quinone diazide elements of U.S. Pat. No. 3,837,860, or of the photodesensitizable type, e.g., such as the bisdiazonium salts of U.S. Pat. No. 3,778,270 or the nitroaromatic composition of U.K. Pat. No. 1,547,548.

The photosensitive layer used in the process is preferably aqueous alkali processible in the sense that it is soluble and thereby developable in aqueous alkali solution, e.g., 1 wt. % $Na_2CO_3$ at 29.4° C. for 90 seconds at a spray pressure of 1.38 kg/cm$_2$.

An element containing an image-yielding, non-blocking photopolymerizable stratum on a strippable support is preferably used such as the one described in copending U.S. patent application Ser. No. 153,639 filed May 27, 1980. Alternatively, particularly if the photopolymerizable layer is tacky, the remaining surface of the supported, photopolymerizable stratum may be protected by a removable cover sheet or when the element is stored in roll form, the stratum surface may be protected by the contiguous reverse surface of the support. The photosensitive composition is present in a dry coating thickness of about 0.0003 inch (~0.0008 cm) to about 0.01 inch (~0.025 cm) or more. A suitable strippable support which preferably has a high degree of dimensional stability to temperature changes, may be chosen from a wide variety of films composed of high polymers, e.g., polyamides, polyolefins, polyesters, vinyl polymers, and cellulose esters, and may have a thickness of from 0.00025 inch (~0.0006 cm) to 0.008 inch (~0.02 cm) or more. A particularly suitable support is a transparent polyethylene terephthalate film having a thickness of about 0.001 inch (~0.0025 cm).

When the invention is used to laminate photosensitive layers, it is essential that the adhesion ($A_1$) of the unexposed photosensitive layer to the polymeric support exceed the breaking strength (B) of the unsupported photosensitive layer. Likewise, the adhesion ($A_2$) of the unexposed photosensitive layer to the substrate must exceed the breaking strength (B) of the of the unsupported photosensitive layer. In addition, since the polymeric support must be strippable from the laminated photopolymerizable layer, the adhesion ($A_2$) of the photolayer to the substrate must also exceed its adhesion ($A_1$) to the polymeric support. Expressed mathematically, $A_2 > A_1 > B$. The proper balance of these adhesive and breaking forces in photosensitive systems can be provided by adjustment of the relative proportions of monomer and binder.

As noted above, the photosensitive layer is also preferably compounded to be relatively hard and nonblocking, i.e., it will not stick to itself or the film support with a greater adhesive strength than the cohesive strength of the layer. The result of this is that a cover sheet is not necessary to prevent the layer from sticking to the support film while in the rolled-up condition for the photosensitive element. This provides a savings in materials costs and eliminates the need for cover sheet stripping and disposal of the stripped cover sheet.

When the element contains no removable, protective cover sheet and is to be stored in roll form, additional protection against blocking can optionally be provided if the reverse side of the strippable support has applied thereto a thin release layer of a material, such as wax or silicone, to prevent blocking with the photopolymerizable stratum. Alternatively, adhesion to the coated photopolymerizable layer may be preferentially increased by flame treating or electrical discharge treating the support surface to be coated.

Suitable removable, protective cover sheets when used may be chosen from the same group of high polymer films described above and may have the same wide range of thicknesses. A cover sheet of 0.001 inch (~0.0025 cm) thick polyethylene is especially suitable. Supports and cover sheets as described above provide good protection to the photopolymerizable resist layer.

The photohardenable layer is prepared from polymeric components (binders), monomeric components, initiators and inhibitors.

Suitable binders which can be used as the sole binder or in combination with others include the following: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides, e.g., epoxides containing acrylate or methacrylate groups; copolymers, e.g., those prepared from the reaction product of a polymethylene glycol of the formula HO(CH$_2$)$_n$OH, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

Preferably, the binder should contain sufficient acidic or other groups to render the composition processible in aqueous developer as described hereinabove. Useful aqueous-processible binders include those disclosed in U.S. Pat. No. 3,458,311 and in U.K. Pat. No. 1,507,704.

Useful amphoteric polymers include interpolymers derived from N-alkylacrylamides or methacrylamides, acidic film-forming comonomer and an alkyl or hydroxyalkyl acrylate such as those disclosed in U.S. Pat. No. 3,927,199 which is incorporated herein by reference.

It is preferred that the photosensitive layer be relatively harder than those which generally have been available before now. Greater hardness of the layer provides greater dimensional stability and thus there is less requirement for support by the support film.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-dydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benezene, and 1,3,5-triisopropenyl benzene.

In addition to the ethylenically unsaturated monomers mentioned above, the photohardenable layer can also contain at least one of the following free radical-initiated, chain-propagating, addition-polymerizable, ethylenically unsaturated compounds having a molecular weight of at least 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such herteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos. 3,427,161; 3,479,185; and 3,549,367 can be used as initiators. Also useful with photoiniators and photoinhibitors are sensitizers disclosed in U.S. Pat. No. 4,162,162.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Various dyes and pigments may be added to increase the visibility of the resist image. Any colorant used, however, should preferably be transparent to the actinic radiation used.

B. Substrate Element

Generally, suitable substrates for the process of the invention involving printed circuit formation are those which have mechanical strength, chemical resistance and good dielectric properties. Thus, most board materials for printed circuits are thermosetting or thermoplastic resins usually combined with a reinforcing agent. Thermosetting resins with reinforcing fillers are ordinarily used for rigid boards, whereas thermoplastic resin without reinforcements are usually used for flexible circuit boards. Ceramic and dielectric coated metals are also useful.

Typical board construction involves combinations such as phenolic or epoxy resins on paper or a paper-glass composite, as well as polyester, epoxy, polyimide, polytetrafluorethylene, or polystyrene on glass. In most instances, the board is clad with a thin layer of electroconductive metal of which copper is by far the most common.

Suitable substrates for the process of the invention involving preparation of lithographic printing plates are those which have mechanical strength and surfaces which differ in hydrophilicity or oleophilicity from the surfaces of the imaged photosensitive areas laminated thereto. Such substrates are disclosed in U.S. Pat. No. 4,072,528. While numerous substrates are satisfactory for this purpose thin anodized aluminum plates such as disclosed in U.S. Pat. No. 3,458,311 are particularly useful.

As noted above, the adhesion of the unexposed photosensitive layer to substrates such as copper or aluminum ($A_2$) must be greater than its breaking strength (B) and its adhesion to the support ($A_1$). A high value for $A_2$ is also needed for many of the applications of this invention where the photosensitive layer must remain adhered to the substrate during exposure to severe chemical or mechanical conditions.

It is essential that the printed circuit substrates used in the process of the invention be clean and free of any extraneous materials to insure that these materials do not interfere with wetting and bonding of the surface. For this reason, it will frequently be desired to clean printed circuit substrates prior to lamination by one or more of the several cleaning processes which are well-known in the field of printed circuit board manufacture. The particular type of cleaning depends upon the type of contamination—organic, particulate or metallic. Such methods include degreasing with solvents and solvent emulsions, mechanical scrubbing, alkaline soaks, acidification and the like, followed by rinsing and drying.

Suitable cleanliness can be very easily determined by the Uniform Water Film test in which the substrate is dipped into water, removed from the water and then the board surface is observed. If a uniform film of water is observed, the board is adequately clean but if a discontinuous streaked film or large droplets are formed, the board is not sufficiently clean to be used in the process of the invention.

C. Prelamination Treatment of Substrate

In the process of the invention, the thermoplastic layer is laminated to the substrate by means of nip rolls. For most applications, and particularly in the manufacture of printed circuit boards from conventional photoresist elements, it is necessary to laminate the photosensitive layer of the element to the substrate board in such manner that the layer is firmly adhered thereto without occlusions and other phase discontinuities such as entrapped air or liquids. Cleaned surfaces tend to deteriorate rapidly immediately after cleaning, e.g., by oxidation or dust. Therefore in a preferred method of practicing the invention, the surface of the substrate, just prior to lamination, is treated to improve adhesion between the photosensitive layer and the substrate by the sequential steps of:

(a) applying a thin layer of inert liquid to the substrate surface immediately prior to lamination of the photosensitive layer thereto; and (b) removing the thin layer of liquid from the substrate surface by vaporization and/or absorption into the photosensitive layer.

In corresponding U.S. Patent Application, Ser. No. 153,638 filed May 27, 1980, filed concurrently herewith, the inert liquid is a nonsolvent with respect to the thermoplastic layer. In a related treating method disclosed in U.S. Patent Application, Ser. No. 153,637 filed May 27, 1980, also filed concurrently herewith, the thin layer of inert liquid is applied to the substrate surface by contacting the surface at a temperature below the condensation point of the liquid with a vapor or gaseous dispersion of the liquid. The inert liquid used to form the film can also be applied in other ways, for example, by brushing, wicking, atomizing spray or by rolling it on using perforated or porous rolls.

The thin liquid layer should cover at least 30 percent of the substrate surface on which the polymer is to be laminated and preferably at least 80 percent. Essentially complete coverage is still further preferred.

Since this invention is preferably integrated into a continuous process in which the support film is removed shortly after lamination, the liquid layer should be sufficiently thin for adhesion to the substrate to occur almost instantaneously. Thus, the liquid should not flood the surface of the substrate such as described in U.S. Pat. No. 4,069,076. Excess liquid interferes with instant adhesion and furthermore fills the interconnective holes which are normally present in a printed circuit substrate and thereby acts as a contaminant in subsequent processing operations.

In practice, it is preferred that the thin liquid layer be as thin as is practicable to displace air at the interface and promote adhesion of the photosensitive layer. While the particular layer thickness will vary somewhat, depending upon the nature of the liquid and the conditions of application, it is generally preferred that it be much thinner than in the prior art processes, e.g., from 1–50μ, the average layer thickness being about 30μ or a preferred range from about 10 to about 50μ.

It is an essential aspect of the substrate treatment that the applied thin liquid film be substantially displaced from the interface between the photosensitive layer and the substrate during the subsequent laminating operation. This is done mainly by diffusion into the laminated polymeric layer. The precise method by which the thin liquid film is displaced is, of course, a function of the liquid and the nature of the photosensitive layer and substrate which are used. When a more volatile liquid is used in conjunction with heated laminating rolls, liquid film displacement may take place partially by vaporization. On the other hand, using a less volatile liquid and/or cooler rolls will result in less volatilization and thus removal of the liquid film will occur to a greater extent by absorption into the laminated polymer layer. Obviously, when nonvolatile liquids are used, the removal of the liquid film takes place essentially by absorption. The precise mechanism by which the liquid film is removed is not critical.

With the above-described thin film treatment, even relatively hard thermoplastic layers can be adhered to substrates effectively. Of course, the substrate has to be clean. Integration of the cleaning operation with the laminating operation provides the required cleanliness. Without the presence of this film during lamination the layer may not instantly adhere to the substrate.

It is preferred that the precleaning operation be carried out in the integrated manner described in copending U.S. patent application Ser. No. 153,636 filed May 27, 1980, filed concurrently herewith.

D. Trimming

When the advancing substrate elements are butted against each other in such manner that there is no significant space between the trailing edge of the leading board and the leading edge of the following board, a single application of longitudinal tensile stress operates to trim the layer simultaneously from both the trailing edge of the leading board and the leading edge of the following board. On the other hand, when successive boards are spaced in such manner that there is a "bridge" of photosensitive layer spanning the gap between the trailing edge of the leading board and the leading edge of the following board, it is necessary to trim the two edges separately. In this case, the tensile stress to trim the leading edge of the boards is applied preferably by removing the support film from the layer as the laminated substrate element emerges from the nip of the laminating rolls by bending the film back along the longitudinal axis of the advancing layer at an obtuse angle, the radius of the bend being sufficiently small that the breaking strength of the layer on the leading edge of the substrate element is exceeded.

The invention will be more clearly understood by reference to the following examples and the detailed description of the Drawing hereinbelow.

EXAMPLE I—RESIST PROPERTIES

A roll of photoresist film having no cover sheet is prepared as follows:

A photosensitive coating solution is prepared having the following composition:

| | Component | Parts by Weight |
|---|---|---|
| (a) | 1:1 Copolymer of styrene and maleic anhydride partially esterified with isobutyl alcohol; mol. wt. ca. 20,000; acid number ca. 180 | 40 |
| (b) | Terpolymer formed of 17% ethyl acrylate, 71% methyl methacrylate, and 12% acrylic acid; mol. wt. ca. 300,000; acid number ca. 105 | 12.6 |
| (c) | Interpolymer formed from 40% N—tert.-octyl acrylamide, 34% methyl methacrylate, 16% acrylic acid, 6% hydroxy propyl methacrylate, and 4% t-butyl amino ethyl methacrylate; mol. wt. ca. 50,000 | 5 |
| (d) | Polyoxyethylated trimethylolpropane triacrylate (20 moles of ethylene oxide) (M.W. 1162) | 10 |
| (e) | Trimethylolpropane triacrylate | 12.5 |
| (f) | Benzophenone | 4 |
| (g) | 4,4'-Bis(dimethylamino) benzophenone (Michler's ketone) | 0.7 |
| (h) | 2,2'-Bis(2-chlorophenyl)-4,4',5,5'-tetraphenyl biimidazole | 3 |
| (i) | Leuco crystal violet | 0.4 |
| (j) | Benzotriazole | 0.2 |
| (k) | 1,4,4-Trimethyl-2,3-diazobicyclo-[3.2.2]-non-2-ene-2,3-dioxide | 0.06 |
| (l) | Victoria Green (C.I. Pigment Green 18) | 0.03 |
| (m) | Methylene chloride | 200 |
| (n) | Methanol | 15 |

Into the above coating solution are dispersed 13 parts by weight of polyethylene beads of which 85% have diameters below 10μ and 15% have diameters between 10 and 20μ. The mixture is coated on a 0.00127 cm thick polyethylene terephthalate web which has coated on its reverse side a thin layer of a mixture of Carnuba wax and poly(vinylidene chloride). The photopolymerizable layer is dried to give a dry thickness of 0.00254 cm and about 30.5 meters of the dried coated element is wound into a roll.

DETAILED DESCRIPTION OF THE DRAWING

Turning now to FIG. 1 of the drawing, each member of a series of substrate elements (boards) for printed circuits 1 is mechanically advanced in a continuous manner on a roller conveyor through cleaning chamber 3 in which both the upper and lower copper-clad surfaces thereof are cleaned by mechanically scrubbing under a heavy water spray. The boards are made of fiberglass-reinforced epoxy resin. The cleaned substrate boards are further advanced through alignment rolls 5, which are clean as defined by the Uniform Water Film test, by which the sides of the boards are precisely aligned. From the alignment rolls 5, each aligned substrate board emerges and is passed between liquid application rolls 6 into which thin layer liquid (in this case, 30% ethanol/water solution) is admitted via line 7 into the interior of the hollow application rolls 6. Preferably the application rolls 6 consists of a metal core perforated in a regular pattern having thereon a hard porous polyethylene sleeve which is covered with a cotton cloth through which the thin layer liquid passes and is coated onto the substrate boards. Liquid level within the application rolls 7 is limited by fixed level outlet line 8. The liquid layers have a thickness of 10 to 50μ. The board with both surfaces coated with a thin layer of liquid is then advanced to a set of upper and lower feed rolls 9 each of which places the unprotected surface of a continuous supported photosensitive layer 11 against the thin liquid layer on the substrate element. A preferred roller drive for advancing the substrate elements is disclosed in copending U.S. patent application Ser. No. 235,415, filed Feb. 17, 1981 which is incorporated herein by reference.

Optional feed rolls 9 place the photosensitive layers against the surfaces of the substrate element without any significant pressure just before the layer and substrate pass to the nip of the laminating rolls. Any excess liquid is removed from the substrate surface by forming a bead at the nip as the element passes between feed rolls 9. By this means moisture is retained between the liquid layer and substrate and thermal exposure is limited to the brief time it is within the nip. In the event of a stoppage, the amount of photosensitive layer subject to thermal degradation is reduced substantially.

The feed rolls 9 are mechanically linked with the mechanism used for advancing the boards 1 in such manner that the boards are butted up against one another as they enter the feed rolls 9 and there is no significant amount of bridging by the film 11 between the trailing and leading edges of each board. The supported photosensitive layers prepared as described in Example I are supplied from supply rolls 12. The abutting boards 1 with the supported photosensitive layers 11 in place are then advanced through the nips of heated laminating rolls 13 in which the photosensitive layer 11 are subjected to both pressure and heat, by which the thin liquid layer is removed from the substrate by absorption into the photosensitive layer. The temperature of the laminating roll surfaces is about 230° F. and the linear speed of the boards through the laminator is about six feet per minute. Lamination is completed within about 40 seconds after the board is cleaned. A preferred actuating crank mechanism for opening and closing the laminating rolls is disclosed in copending U.S. patent application Ser. No. 235,412, filed Feb. 17, 1981 which is incorporated herein by reference.

The laminated boards 1 still abutting each other, are advanced at a uniform rate between wedges 15. At the exit of the wedges 15, the poly(ethylene terephthalate) web 17 on the outer surface of the continuous film is pulled back uniformly from the substrate at an obtuse angle (here 150°) which causes the photosensitive layer to be trimmed in a straight line along the leading edge of the board 1). The web 17 is pulled back by the action of take-up rolls 19 and the advancing action of the board. A preferred mandrel slip clutch mechanism for maintaining proper tension on the take-up roll is disclosed in copending U.S. patent application Ser. No. 235,413, filed Feb. 17, 1981 which is incorporated herein by reference.

As the substrate board 1 emerges from between wedges 15 progressively more of the photosensitive layer is uncovered until the board advances to and is grasped firmly at the sides between a pair of clutch-driven trimming rolls 21, which rotate at a speed faster than the linear speed of the advancing board until they grasp the panel sides. The trimming rolls then move with the linear speed of the board by means of a slip clutch which compensates for the difference in driving speeds. The trimming rolls 21 place a tensile stress on the layers which causes the thermoplastic layers to be trimmed smoothly along the trailing edge of the board as it emerges from between the wedges 15. An alternative and further preferred means for grasping the laminated and trimmed substrate element is disclosed in U.S. patent application Ser. No. 235,414, filed Feb. 17, 1981 which is incorporated herein by reference. When the trailing edge trimming is completed, thus separating the leading and trailing boards in the series, the laminated board is ready for circuit preparation by conventional photoresist techniques.

FIG. 2 is a schematic representation in cross-section of a preferred method of carrying out the lamination step of the invention in which after laydown of a thin liquid film 100, the photosensitive layer 102 adhered to support film 104 is laminated to substrate 106 which is coated with a thin layer of copper 107 by passage through laminating rolls 108 and 110. The strength of the adhesive bond ($A_2$) between the copper coating 107 of the substrate and the photosensitive layer 102 exceeds the strength of the adhesive bond ($A_1$) between the photosensitive layer 102 and support 104.

FIG. 3 is a schematic representation in cross-section of the preferred method of trimming the front edge of laminated substrate 106 in which the advancing substrates in the series are spaced. Upon emergence from the laminating rolls, the support 104 and photosensitive layer 102 are pulled back at an obtuse angle and small radius over wedge 112 so that the breaking strength (B) of the photosensitive layer 102 at the front edge of the substrate 106 is exceeded which causes breaking of layer 102 across the leading edge of substrate 106 as is shown in FIG. 3B. For this operation, $A_1$ is greater than $A_2$ which in turn is greater than B.

FIG. 4 is a schematic representation in cross-section of the method of trimming the trailing edge of laminated substrate 106 when the advancing substrates in the series are spaced. As the support is removed from the trailing edge of substrate 106, a longitudinal tensile stress perpendicular to the trailing edge, i.e., parallel to and in the direction of travel, is applied by pulling on the leading edge of the substrate so that the breaking strength (B) of the photosensitive layer 102 along the trailing edge is exceeded.

Though the process of the invention as described above is carried out continuously, it will be recognized tht the process can also be conducted intermittently as well.

It is preferred that the thermoplastic layer to be used in the process be relatively harder than most photosensitive layers. The hardness of the layer also makes the layer relatively brittle, i.e., under high shear, the layer loses strength apparently by a reduction in viscosity, whereby the layer exhibits dilatant character. The process takes advantage of this in that, upon tensioning of the layer after lamination, the layer breaks along the substrate trailing edge and does not just elongate and fracture irregularly as would be the case with softer layers.

In a preferred aspect, the process is simultaneously practiced on both sides of the succession of substrates so that photopolymerizable layer is laminated to both sides of the substrates. In this instance, it is especially important that no liquid be present in the holes in the substrate, lest the heat of lamination vaporize the liquid and cause the "tents" of photosensitive layer over the holes in the substrate to expand and burst. It is also preferred that the succession of substrates be close enough that the spring-loaded lamination rolls normally used for lamination do not "bottom" between substrates. This avoids bonding together of the two photopolymerizable layers extending between the successive substrates, that is the "hinges" between successive substrates, since such bonding is likely to interfere with self-trimming of the leading edge when the support films are removed. Alternatively, the pressure on the lamination rolls can be reduced to minimize bonding of the layers. It is preferred, however, that "hinging" itself be kept to a minimum to facilitate the self-trimming function.

EXAMPLE II—PREPARATION OF A LITHOGRAPHIC PRINTING PLATE

A photosensitive coating mixture was prepared and coated as in Example I except that instead of the beads used therein, 16 parts by weight of 1 micron polyethylene beads (Microfine VIII—F. Gold, tradename of Dura Commodities Corporation, Harrison, NY) were dispersed in the coating solution. The surface of a 0.023 cm thick aluminum plate was scrubbed with tungsten carbide brushes in water using a Chemcut ® Model 107 (tradename of Chemcut Corporation, State College, PA) Mechanical Cleaning System and the scrubbed surface was laminated to the photosensitive layer and the layer trimmed as described in Example I.

The laminated and trimmed board was imaged by exposing for 60 seconds the photosensitive layer through a halftone and line transparency to U.V. radiation from a 2000 watt pulsed Xenon arc light source in a flip top platemaker. The unexposed areas were completely removed by development in a 1% aqueous solution of sodium carbonate to provide a halftone polymeric image with complimentary image areas of bare aluminum surface. The resulting lithographic printing plate was conventionally gummed with Lydel ® Finishing Solution (LDFS) (tradename of E. I. du Pont de Nemours and Company, Wilmington, DE) and mounted on an A. B. Dick Model 380 offset printing press. Using standard inking and fountain solutions, at least 3500 copies of good quality were obtained from the printing plate.

We claim:

1. An integrated process for laminating a continuous layer of photosensitive composition to a surface of each member of a series of substrate elements and trimming the layer from at least one of the transverse edges of the laminated substrate elements comprising the sequential steps of:
   (1) advancing a continuous layer of photosensitive organic polymeric composition, the layer being supported on one side only by a strippable polymeric film, and advancing the continuous supported layer and a first substrate element to the nip of a set of laminating rolls;
   (2) contacting the unsupported surface of the supported layer with a surface of the substrate element within the nip under pressure to effect lamination of the layer to the surface of the substrate element;
   (3) pulling on the laminated substrate element along its longitudinal axis in the direction of advancement by which the breaking strength of the laminated layer and, if present, the support film is exceeded at a trailing edge of the substrate transversely to the direction of advancement; and
   (4) repeating the sequence of steps (2) through (3) with respect to subsequent substrate elements in the series.

2. An integrated process for laminating a continuous layer of photosensitive composition to a surface of each member of a series of substrate elements and trimming the layer from at least one of the transverse edges of the laminated substrate elements comprising the sequential steps of:
   (1) advancing a continuous layer of photosensitive organic polymeric composition, the layer being supported on one side only by a strippable polymeric film, and advancing the continuous supported layer and a first substrate element to the nip of a set of laminating rolls;
   (2) contacting the unsupported surface of the supported layer with a surface of the substrate element within the nip under pressure to effect lamination of the layer to the surface of the substrate element;
   (3) removing the support film from the layer as the laminated substrate element emerges from the nip of the laminating rolls and continuing advancement of the laminated substrate element until the support film is completely removed from the laminated layer;
   (4) pulling on the laminated substrate element along its longitudinal axis in the direction of advancement by which the breaking strength of the laminated layer and the support film is exceeded at a trailing edge of the substrate transversely to the direction of advancement; and
   (5) repeating the sequence of steps (2) through (4) with respect to subsequent substrate elements in the series.

3. The process of claims 1 or 2 in which the substrate elements in the series are abutting.

4. The process of claim 2 in which the substrate elements in the series are spaced and a leading edge of each element is trimmed during step (3) by bending the film back along the longitudinal axis of the advancing layer at an obtuse angle, the radius of the bend being sufficiently small that the breaking strength of the web on the leading edge of the substrate element is exceeded.

5. The process of claim 1 in which the photosensitive composition has randomly dispersed therein nonfibrous solid particles having a particle size of 0.1–25 microns, the layer having an optical density below about 0.7 and elongation at break between about 2 and 50%.

6. The process of claim 1 in which the unsupported surface of the supported layer and the surface of the substrate element to be laminated are brought into contact without pressure immediately before step (2).

7. The process of claim 1 in which prior to step (2) the surface of the substrate element is treated by first forming a thin layer of inert liquid thereon and then removing the thin layer of liquid from the surface by absorption into the photosensitive layer during lamination step (2).

8. The process of claim 1 in which both surfaces of the substrate element are laminated simultaneously.

9. The process of claims 1 or 2 in which the support film is removed by the action of driven take-up rolls.

10. The process of claim 1 in which the pulling action on the laminated substrate element is carried out in step (4) by grasping and advancing the element in friction contact between the sides of the element and a set of driven rolls rotating on an axis perpendicular to the plane of the advancing substrate elements.

11. The process of claim 1 in which the photosensitive composition is comprised of (a) addition polymerizable ethylenically unsaturated monomer; (b) an initiating system activatable by actinic radiation; and (c) an organic polymeric binder containing at least two percent by weight of amphoteric polymer which is an interpolymer of (1) 30–60 percent by weight of a comonomer selected from the group consisting of $C_{2-12}$ N-alkyl acrylamide and $C_{2-12}$ N-alkyl methacrylamide, $C_{1-4}$ alkyl ($C_{2-4}$) aminoalkyl acrylates and $C_{1-4}$ alkyl ($C_{2-4}$) amino alkyl methacrylates, and mixtures thereof; (2) 10–25 percent by weight of an acidic comonomer selected from the group consisting of acrylic, methacrylic, crotonic, itaconic, maleic and fumaric acids and $C_{1-4}$ alkyl half esters of maleic and fumaric acid, and mixtures thereof; and (3) 20–55 percent of a copolymerizable comonomer selected from the group consisting of $C_1$–$C_{12}$ alkyl acrylates, $C_1$–$C_{12}$ alkyl methacrylates, $C_{2-4}$ hydroxyalkyl acrylates, hydroxystearyl acrylate, hydroxyalkyl methacrylates, hydroxystearyl methacrylates, and mixtures thereof.

12. The process of claim 11 in which the binder is comprised of a major continuous phase of organic polymer having randomly dispersed therein a minor discontinuous phase of nonfibrous solid particles having a particle size of 0.1–25 microns, the layer having an elongation at break between about 2 and 50%.

* * * * *